US011320847B2

(12) United States Patent
Kim et al.

(10) Patent No.: US 11,320,847 B2
(45) Date of Patent: May 3, 2022

(54) VOLTAGE REGULATION INTEGRATED CIRCUIT (IC) WITH CIRCUIT COMPONENTS IN AN INTEGRATED THREE-DIMENSIONAL (3D) INDUCTOR CORE AND RELATED METHODS OF FABRICATION

(71) Applicant: QUALCOMM Incorporated, San Diego, CA (US)

(72) Inventors: Jonghae Kim, San Diego, CA (US); Ravindra Vaman Shenoy, Dublin, CA (US); Milind Shah, San Diego, CA (US); Evgeni Gousev, Saratoga, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 126 days.

(21) Appl. No.: 16/804,474

(22) Filed: Feb. 28, 2020

(65) Prior Publication Data

US 2021/0271275 A1     Sep. 2, 2021

(51) Int. Cl.
*G05F 1/56* (2006.01)
*H01F 27/28* (2006.01)
(Continued)

(52) U.S. Cl.
CPC ........... *G05F 1/56* (2013.01); *H01F 27/2804* (2013.01); *H01F 41/041* (2013.01); *H02M 7/155* (2013.01)

(58) Field of Classification Search
CPC ...... G05F 1/56; H01F 27/2804; H01F 41/041; H01F 2017/0086; H02M 7/155; H01L 23/49822
See application file for complete search history.

(56) References Cited

U.S. PATENT DOCUMENTS 9,230,987 B2 * 1/2016 Pachamuthu ..... H01L 27/11551
10,074,667 B1 * 9/2018 Higashi ............. H01L 27/11553
(Continued)

FOREIGN PATENT DOCUMENTS

WO    WO-2019066969 A1    4/2019
WO    WO-2019144574 A1    8/2019

OTHER PUBLICATIONS

Bellaredj, M. et al., "Fabrication, Characterization and Comparison of FR4-Compatible Composite Magnetic Materials for High Efficiency Integrated Voltage Regulators with Embedded Magnetic Core Micro-inductors," 2017 IEEE 67th Electronic Components and Technology Conference, May 30-Jun. 2, 2017, Orlando, FL, USA, IEEE, pp. 2008-2014.

(Continued)

*Primary Examiner* — Adolf D Berhane
*Assistant Examiner* — Afework S Demisse
(74) *Attorney, Agent, or Firm* — Qualcomm Incorporated

(57) ABSTRACT

Reducing the space occupied by a voltage regulation integrated circuit (IC) that includes an inductor is achieved by implementing the inductor as a 3D inductor having windings formed of conductive elements integrated into a lower substrate, a circuit layer, and an upper substrate, and positioning other components within a core space of the 3D inductor in the circuit layer. The space occupied by the inductor is shared with the other circuit components and with the structural layers of the voltage regulation IC. A voltage regulation IC may be a switched-mode power supply (SMPS) that includes an inductor with a capacitor and/or a switching circuit. The inductor is implemented as upper horizontal traces in an upper substrate, lower horizontal traces in a lower substrate, and vertical interconnects in a circuit layer between the upper substrate and the lower (Continued)

substrate, and the conductive elements form the 3D inductor as a rectangular coil.

21 Claims, 10 Drawing Sheets

(51) Int. Cl.
*H01F 41/04* (2006.01)
*H02M 7/155* (2006.01)

(56) References Cited

U.S. PATENT DOCUMENTS

| | | |
|---|---|---|
| 2011/0204472 A1 | 8/2011 | Pagaila et al. |
| 2013/0335059 A1 | 12/2013 | Saraswat et al. |
| 2017/0062119 A1 | 3/2017 | Zybura et al. |
| 2019/0385959 A1 | 12/2019 | Xu et al. |
| 2021/0074634 A1 | 3/2021 | Zuo et al. |

OTHER PUBLICATIONS

Moghadam, H. et al., "Design Considerations of Monolithically Integrated Voltage Regulators for Multicore Processors," 2018 IEEE International Symposium on Circuits and Systems (ISCAS), May 27-30, 2018, Florence, Italy, IEEE, 5 pages.
International Search Report and Written Opinion—PCT/US2021/019639—ISA/EPO—dated Jul. 9, 2021.

\* cited by examiner

VOLTAGE REGULATION INTEGRATED CIRCUIT (IC) WITH CIRCUIT COMPONENTS IN AN INTEGRATED THREE-DIMENSIONAL (3D) INDUCTOR CORE AND RELATED METHODS OF FABRICATION

BACKGROUND

I. Field of the Disclosure

The field of the disclosure relates to miniaturization of electronic circuits, and more particularly to reducing an amount of space occupied by an integrated circuit for regulating voltage.

II. Background

Electronic devices have become smaller, faster, and more power efficient over time in response to consumer demand. This trend is made possible by technological improvements to integrated circuits (ICs) within electronic devices. ICs are designed to operate at a particular operating voltage for normal operation. ICs consume power based on several factors, including the voltage at which they operate. ICs receive power from a power source in an electronic device, such as a battery or an adaptor connected to an alternating current (AC) power supply. The power source provides power at a particular voltage, but the power supply voltage needed by a particular IC may not be the same as the voltage provided by the power source. As a result, electronic devices include voltage regulation circuits to convert a power signal from a first voltage at the power supply to a second voltage needed in an IC.

One type of voltage regulation circuit for converting a power source into a direct current (DC) power supply having a desired voltage level is known as a switched-mode power supply (SMPS). Different types of SMPSs have been developed to convert an AC signal to a DC signal, and to convert a DC signal at a first voltage level to a DC signal at a higher or lower voltage level. A voltage regulation circuit includes a capacitor and a switching circuit which, like the other circuits in an electronic device, may need to be miniaturized according to the trend. The physical sizes of circuit components depend on circuit requirements, and those requirements may enable components of a particular technology to be reduced in size gradually, with the evolution of technology. However, there is a demand for the sizes of voltage regulation circuits to be reduced in electronic devices, which may require changes to existing component technology.

SUMMARY OF THE DISCLOSURE

Aspects disclosed herein include a voltage regulation integrated circuit (IC) with circuit components disposed in an integrated three-dimensional (3D) inductor core. Related methods for fabricating the voltage regulation IC are also disclosed. Reducing the space occupied by a voltage regulation IC that includes an inductor is achieved in a two-part approach. Rather than positioning a surface-mounted inductor on the top surface of a substrate (e.g., in an encapsulation layer), the inductor is implemented as a 3D inductor having windings formed of conductive elements integrated into a lower substrate, a circuit layer, and an upper substrate. In addition, rather than mounting the other circuit components of the voltage regulation IC adjacent to a surface-mounted inductor on a substrate, the other components are positioned within a core space of the 3D inductor in the circuit layer. In this regard, the space occupied by the inductor is shared with the other circuit components and with the structural layers of the voltage regulation IC to have a smaller footprint width and smaller height.

In one example, a voltage regulation IC may be a switched-mode power supply (SMPS) that converts a received power supply signal into a direct current (DC) signal having a voltage needed to power ICs in an electronic device. The voltage regulation IC includes an inductor and also includes other circuit components, such as a capacitor and/or a switching circuit. In exemplary aspects disclosed herein, the inductor is implemented as a 3D inductor formed of conductive elements including upper horizontal traces in an upper substrate, lower horizontal traces in a lower substrate, and vertical interconnects in a circuit layer. The vertical interconnects extend between the upper substrate and the lower substrate, and together, the conductive elements form the 3D inductor as a rectangular coil extending longitudinally between the upper and lower substrates in a first direction.

By employing a 3D inductor integrated into the voltage regulation IC, and disposing the other circuit components within the core space of the integrated 3D inductor, the inductor cross-section can be increased to provide a desirable inductance increase, while the height and footprint width of the voltage regulation IC are reduced. Inductance can be further increased by incorporating magnetic material to increase the magnetic permeability of the core space of the 3D inductor. To this end, magnetic layers are disposed on sides of the circuit components within the core space, and a magnetic thin-film may be integrated into the upper substrate within the core space.

In this regard, in one aspect, a voltage regulation IC is disclosed. The voltage regulation IC includes an upper substrate including a plurality of upper horizontal traces, a lower substrate below the upper substrate and including a plurality of lower horizontal traces, and a circuit layer between the upper substrate and the lower substrate. The circuit layer includes a plurality of first vertical interconnects each coupled to a first end of one of the plurality of upper horizontal traces and a first end of one of the plurality of lower horizontal traces, and a plurality of second vertical interconnects each coupled to a second end of one of the plurality of upper horizontal traces and a second end of one of the plurality of lower horizontal traces. The circuit layer also includes one or more circuit components disposed on the lower substrate, and a 3D inductor electrically coupled to at least one of the one or more circuit components. The 3D inductor includes a coil extending along a longitudinal axis, a cross-section of the coil orthogonal to the longitudinal axis including the at least one of the one or more circuit components.

In another aspect, a method of fabricating a voltage regulation IC is disclosed. The method includes forming an upper substrate including a plurality of upper horizontal traces, forming a lower substrate including a plurality of lower horizontal traces and forming a circuit layer. Forming the circuit layer includes disposing one or more circuit components on a surface of the lower substrate on a region including the plurality of lower horizontal traces, forming a molding compound over the one or more circuit components, and forming a plurality of first vertical interconnects and a plurality of second vertical interconnects in the molding compound with a bottom end of each of the plurality of first and second vertical interconnects coupled to one of the plurality of lower horizontal traces in the lower substrate. The method further includes disposing the upper substrate on the circuit layer such that each of the plurality of upper horizontal traces couples to one of the plurality of first vertical interconnects and to one of the plurality of second vertical interconnects in the circuit layer, and the plurality of upper horizontal traces, the plurality of first vertical interconnects, the plurality of lower horizontal traces, and the plurality of second vertical interconnects form a 3D inductor.

DETAILED DESCRIPTION

Figure 1:
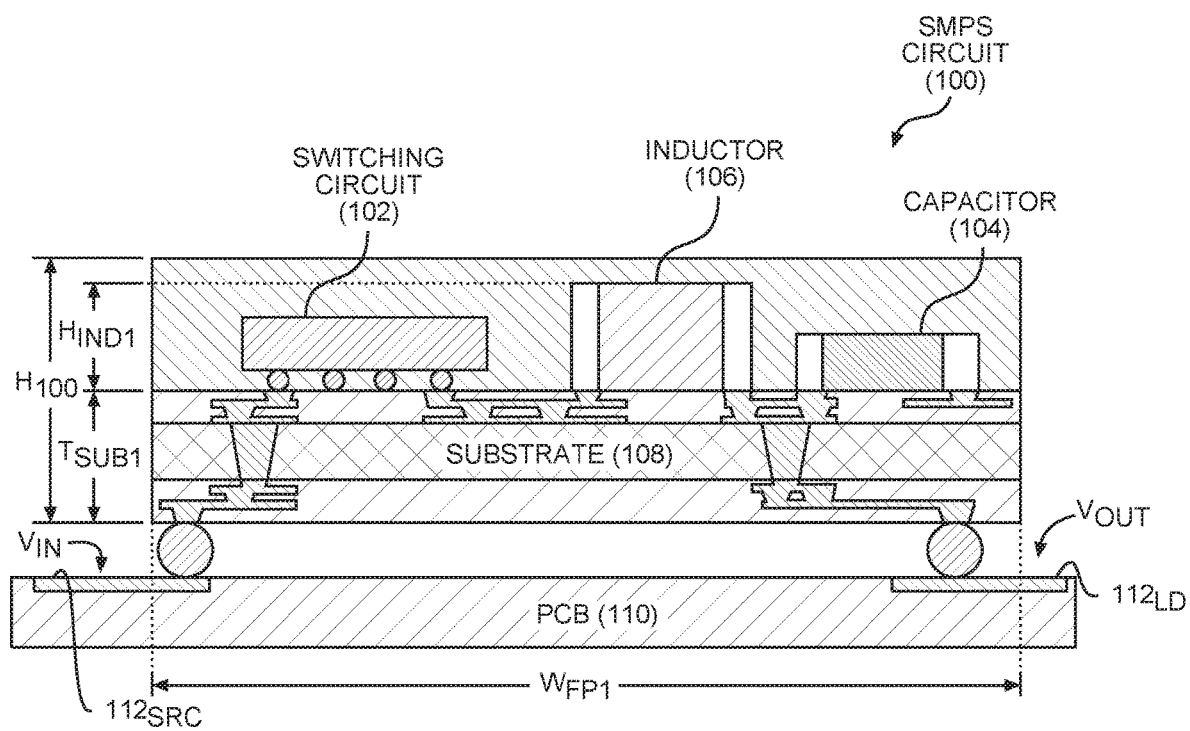
FIG. 1 is a cross-sectional side view of a conventional switched-mode power supply (SMPS) voltage regulation circuit including a switching circuit, an inductor, and a capacitor mounted on a substrate on a printed circuit board (PCB)

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include a voltage regulation integrated circuit (IC) with circuit components disposed in an integrated three-dimensional (3D) inductor core. Related methods for fabricating the voltage regulation IC are also disclosed. Reducing the space occupied by a voltage regulation IC that includes an inductor is achieved in a two-part approach. Rather than positioning a surface-mounted inductor on the top surface of a substrate (e.g., in an encapsulation layer), the inductor is implemented as a 3D inductor having windings formed of conductive elements integrated into a lower substrate, a circuit layer, and an upper substrate. In addition, rather than mounting the other circuit components of the voltage regulation IC adjacent to a surface-mounted inductor on a substrate, the other components are positioned within a core space of the 3D inductor in the circuit layer. In this regard, the space occupied by the inductor is shared with the other circuit components and with the structural layers of the voltage regulation IC to have a smaller footprint width and smaller height.

In one example, a voltage regulation IC may be a switched-mode power supply (SMPS) that converts a received power supply signal into a direct current (DC) signal having a voltage needed to power ICs in an electronic device. The voltage regulation IC includes an inductor and also includes other circuit components, such as a capacitor and/or a switching circuit. In exemplary aspects disclosed herein, the inductor is implemented as a 3D inductor formed of conductive elements including a plurality of upper horizontal traces in an upper substrate, a plurality of lower horizontal traces in a lower substrate, and a plurality of vertical interconnects in a circuit layer. The plurality of vertical interconnects extend between the upper substrate and the lower substrate, and together, the conductive elements form the 3D inductor as a rectangular coil extending longitudinally between the upper and lower substrates in a first direction.

By employing a 3D inductor integrated into the voltage regulation IC, and disposing the other circuit components within the core space of the integrated 3D inductor, the inductor cross-section can be increased to provide a desirable inductance increase, while the height and footprint width of the voltage regulation IC are reduced. Inductance can be further increased by incorporating magnetic material to increase the magnetic permeability of the core space of the 3D inductor. To this end, magnetic layers are disposed on sides of the circuit components within the core space, and a magnetic thin-film may be integrated into the upper substrate within the core space.

Figure 2:
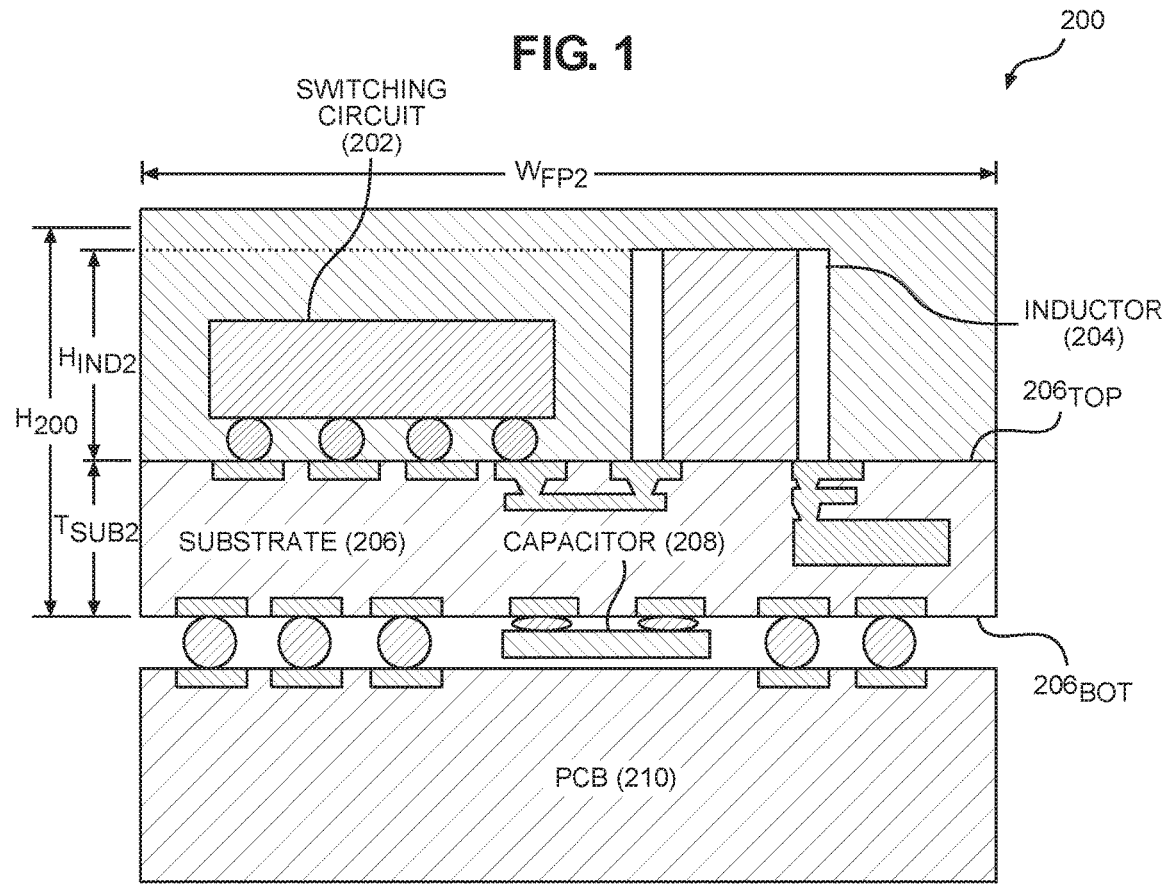
FIG. 2 is a cross-sectional side view of another SMPS voltage regulation circuit including a switching circuit and an inductor mounted on a top surface of the substrate with a capacitor mounted to a bottom surface of the substrate to reduce a footprint width compared to the SMPS voltage regulation circuit in FIG. 1.
Figure 3:
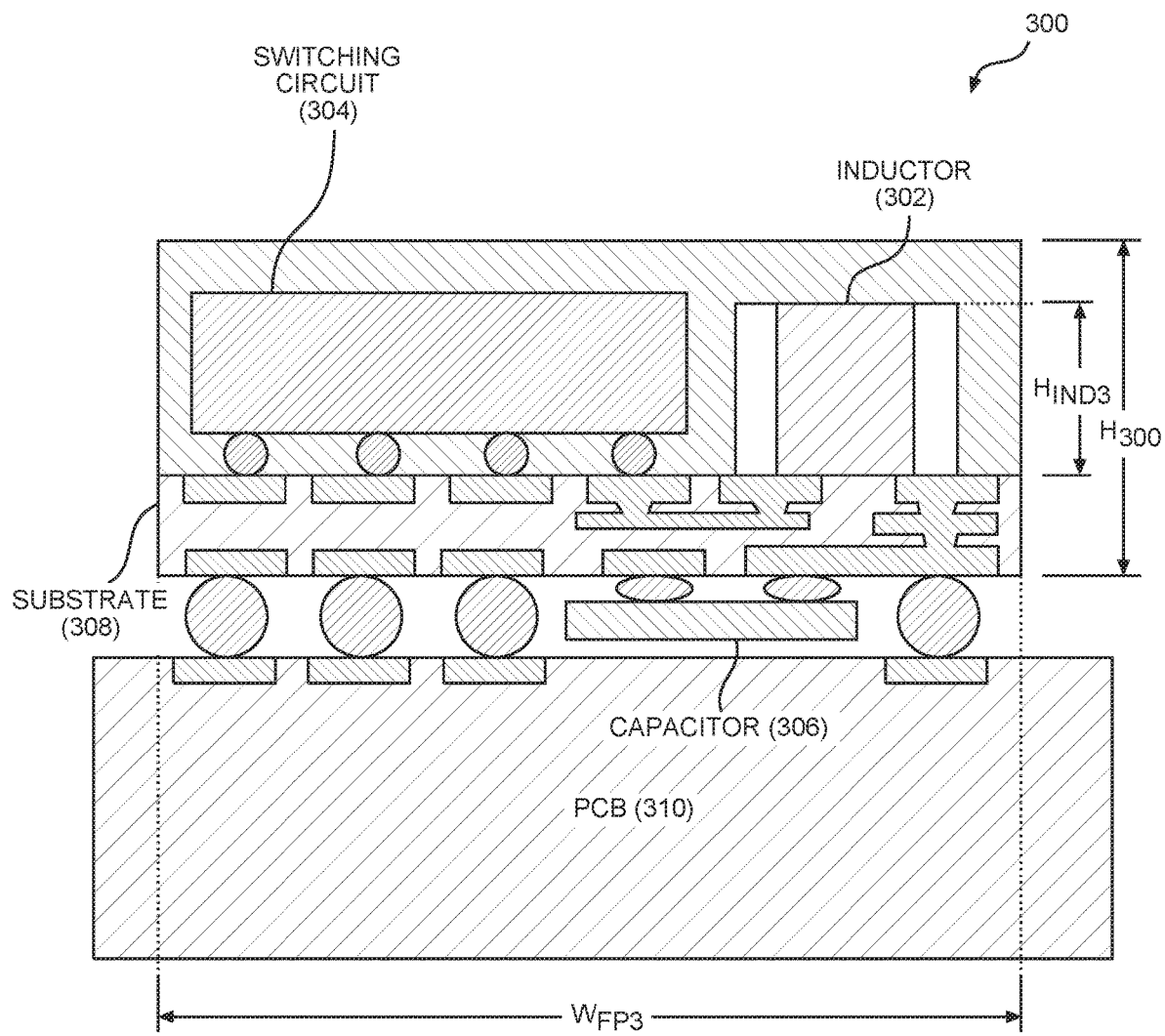
FIG. 3 is a cross-sectional side view of the SMPS voltage regulation circuit in FIG. 2 with an under-sized inductor employed to achieve a maximum height objective for the SMPS voltage regulation circuit.

FIGS. 1 through 3 illustrate that inductor size requirements are a significant factor in determining the dimensions of SMPS voltage regulation circuits 100, 200, 300, and such dimensions cannot be reduced without a solution for efficiently addressing the space occupied by the inductor.

FIG. 1 is an illustration of a cross-sectional side view of a SMPS voltage regulation circuit ("SMPS circuit") 100 including a switching circuit 102, a capacitor 104, and an inductor 106 as discrete circuit components affixed to a substrate 108 by, for example, a surface mount (SMT) process. The substrate 108 includes vertical and horizontal interconnects between the circuit components, and interconnects to a printed circuit board (PCB) 110 on which the substrate 108 is mounted. Dimensions of the capacitor 104 and the inductor 106 are determined, at least in part, by electrical requirements of the SMPS circuit 100. Thus, a vertical height $H_{100}$ of the SMPS circuit 100 is determined by a thickness $T_{SUB1}$ of the substrate 108 and a height $H_{IND1}$ of the inductor 106 mounted on the substrate 108. A footprint width $W_{FP1}$ of the SMPS circuit 100 is determined by the width dimensions of the capacitor 104, the inductor 106, and the switching circuit 102 mounted on the substrate 108. The SMPS circuit 100 receives a DC power supply signal having a first (e.g., higher) voltage $V_{IN}$ at a first connector $112_{SRC}$ on the PCB 110 and supplies a DC signal at a second (e.g., lower) voltage $V_{OUT}$ to a second connector $112_{LD}$ on the PCB 110. The SMPS circuit 100 could be, for example, a buck converter, a boost converter, or other a voltage regulation circuit of another type.

For purposes of explanation, a buck converter is described as an example of the SMPS circuit 100. A buck converter includes a switching circuit and a resonant (LC) circuit formed by the inductor 106 and the capacitor 104. The switching circuit receives an input DC signal at a first (i.e., higher) voltage from a power supply and periodically switches to provide or not provide the input DC signal to the LC circuit according to a duty cycle. The LC circuit provides an output DC signal at a second (i.e., lower) voltage to a load circuit depending on the input DC signal and the duty cycle. Operational details of voltage converter circuits are well known and not pertinent to this disclosure, so are not presented herein. However, the physical dimensions of the inductor 106 depend on the electrical requirements of the SMPS circuit 100. Although the inductor 106 is discussed in the context of a buck converter, the principles disclosed herein could be applied to other SMPS circuits.

The required inductance (L) of an inductor in a buck converter can be calculated according to the following equation:

$$L=((V_{IN}-V_{OUT}) \times D_{CY})/(F_{SW} \times \Delta i_L), \text{ where:}$$

$V_{IN}$=Input Voltage;
$V_{OUT}$=Output Voltage;
$D_{CY}$=Duty Cycle;
$f_{SW}$=switching frequency; and
$\Delta i_L$=change in inductor current.

According to the above equation, the inductance (L) of an inductor in a buck converter inversely depends on the switching frequency ($f_{SW}$) at which the buck converter is switched. That is, as the switching frequency ($f_{SW}$) of a processing circuit increases, the inductance required in the inductor of a buck converter providing a DC voltage to that processing circuit decreases. Therefore, assuming other variables remain constant, the inductance requirements of an inductor in a buck converter supplying a DC voltage to a load circuit will be reduced as the load circuits in electronic devices trend toward faster clocking speeds. Since the inductance of inductors directly depends on the diameter and number of their windings or turns (i.e., larger diameter and more windings provide greater inductance), and inductance requirements are decreasing over time as the switching frequency ($f_{SW}$) increases, smaller inductors may be employed in the future. Nonetheless, the diameter and length (i.e., total volume) of an inductor continues to be a significant factor in the dimensions of existing voltage regulation ICs.

Based on the equation above for inductance (L), as IC clock frequencies increase from the range of about 3.2 Megahertz (MHz) to about 30 MHz, the inductance required in the SMPS circuit 100 will decrease from about 500 nanohenries (nH) to about 50 nH. At current clock frequencies, however, the height $H_{IND1}$ of the inductor 106 employed in the SMPS circuit 100 is in the range of about one millimeter (1 mm). It will not be possible to significantly reduce the height $H_{IND1}$ of the inductor 106 until much higher circuit switching frequencies become possible. Thus, a total height of the SMPS circuit 100 is far in excess of 600 micrometers (µm), which is a design objective for voltage regulation ICs.

FIG. 2 is a cross-sectional side view of a SMPS circuit 200, which is another configuration of a voltage regulation IC. The illustrations in FIG. 1 and FIG. 2 are at different scales, as indicated by the respective sizes of the switching circuits 102 and 202. In this regard, it can be recognized that the SMPS circuit 200 has a footprint width $W_{FP2}$ that is reduced compared to the footprint width $W_{FP1}$ of the SMPS circuit 100 in FIG. 1.

In FIG. 2, the switching circuit 202 and an inductor 204 are mounted on a top surface $206_{TOP}$ of a substrate 206 while a capacitor 208 is disposed on a bottom surface $206_{BOT}$ of the substrate 206 between the substrate 206 and a PCB 210. In the configuration in FIG. 2, area is more efficiently used by mounting components on the top and bottom surfaces $206_{TOP}$ and $206_{BOT}$ of the substrate 206. As a result, the SMPS circuit 200 having the voltage regulation of the SMPS circuit 100 in FIG. 1 can be realized with a smaller footprint width $W_{FP2}$ than the footprint width $W_{FP1}$ in FIG. 1. However, a minimum height $H_{200}$ of the SMPS circuit 200 in FIG. 2 is still at least a total of a height $H_{IND2}$ of the inductor 204 and a thickness $T_{SUB2}$ of the substrate 206. Thus, the SMPS circuit 200 has a smaller footprint but does not have a reduced height compared to the SMPS circuit 100 in FIG. 1.

FIG. 3 is a cross-sectional side view of a SMPS circuit 300 with an inductor 302, a switching circuit 304, and a capacitor 306. FIG. 3 is also drawn to a different scale than FIG. 1. The SMPS circuit 300 in FIG. 3 includes a substrate 308 having a reduced footprint width $W_{FP3}$ on a PCB 310 like the SMPS circuit 200 in FIG. 2. In addition, a height $H_{IND3}$ of the inductor 302 is reduced compared to FIG. 2 so the SMPS circuit 300 can have a desired height $H_{300}$, according to design objectives. However, due to the reduced height $H_{IND3}$ of the inductor 302, the amount of inductance of the inductor 302 is not sufficient to meet circuit requirements at current switching frequencies of electronic circuits.

Thus, FIGS. 1-3 illustrate that both a footprint reduction and a height reduction of the SMPS circuit 100 in FIG. 1 cannot be realized in a circuit that can still provide adequate function in current electronic circuits.

A solution disclosed herein is to replace the surface-mounted inductors shown in FIGS. 1 through 3 with a 3D inductor, which can provide the inductance required by a SMPS circuit and has a structure that can be integrated into layers of a voltage regulation IC described below with reference to FIG. 7. Before discussing details of the voltage regulation IC in FIG. 7, examples of 3D inductors are introduced in FIGS. 4-6.

Figure 4:
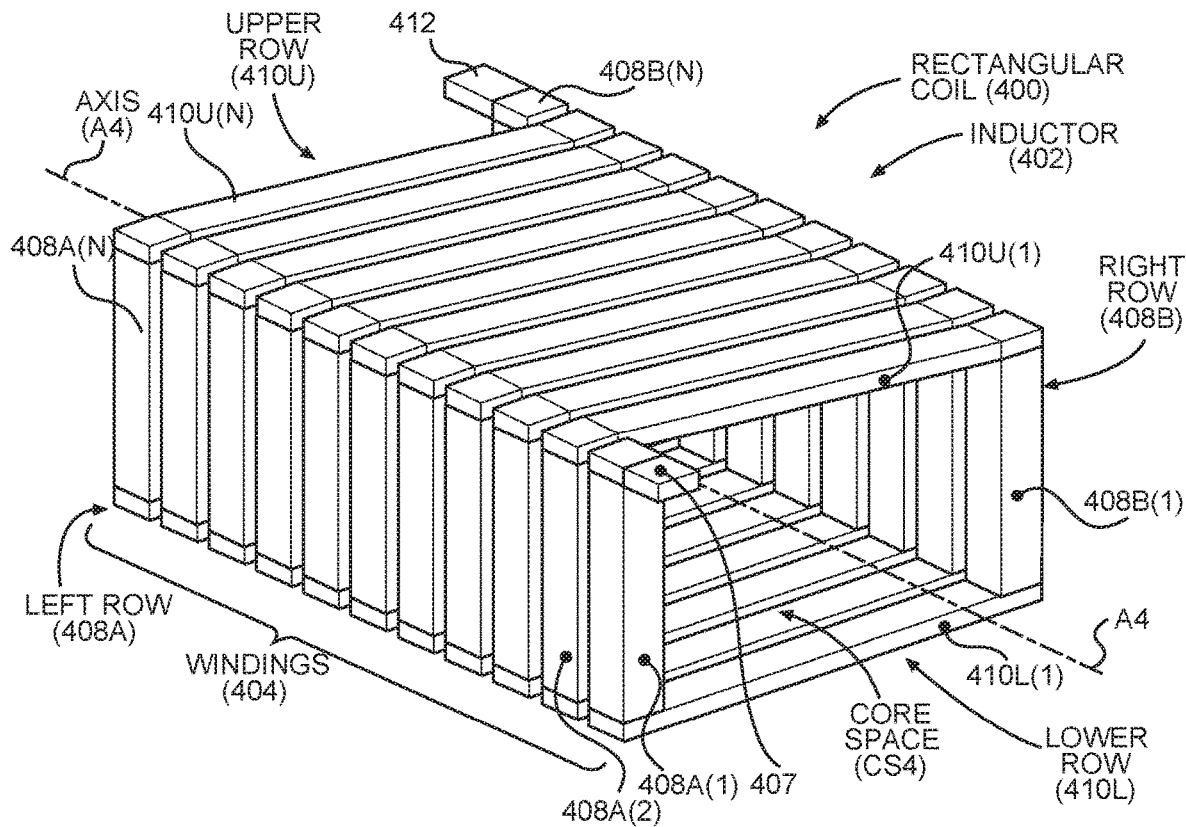
FIG. 4 is a perspective view of an example of a rectangular coil forming a three-dimensional (3D) inductor that is not integrated into layers of an integrated circuit (IC)

The inductance of a straight conductor (e.g., a wire) is increased when the conductor forms a circle. A conductor wound continuously around a core in a tubular shape has a strong inductance and is referred to herein as a 3D inductor, and may also be known as a 3D solenoid inductor. FIG. 4 is a perspective view of a rectangular coil 400 for forming a 3D inductor 402 ("inductor 402"). The rectangular coil 400 is formed of windings 404 having a rectangular cross-section approximating a tubular construction. Each winding 404 of the rectangular coil 400 extends one revolution around a core space CS4 of the rectangular coil 400, and an axis A4 of the core space CS4 extends in a longitudinal direction.

The rectangular coil 400 is a sequence of conductive horizontal traces and vertical interconnects electrically coupled to form a single continuous conductor beginning at a first terminal 407. The first terminal 407 is connected to a top end of a left vertical interconnect 408A(1). A bottom end of the left vertical interconnect 408A(1) is coupled to a left end of a lower horizontal trace 410L(1). A right end of the lower horizontal trace 410L(1) is coupled to a bottom end of a right vertical interconnect 408B(1). A top end of the right vertical interconnect 408B(1) is coupled to a right end of an upper horizontal trace 410U(1), and the left end of the upper horizontal trace 410U(1), couples to a left vertical interconnect 408A(2) adjacent to the first terminal 407, which completes the first winding 404.

A next winding 404 of the rectangular coil 400 is formed by the next left vertical interconnect 408A(2), a next lower horizontal trace 410L(2), a next right vertical interconnect 408B(2), and a next upper horizontal trace 410U(2). The left vertical interconnects 408A(1)-408A(N) are disposed parallel to each other in a left vertical row 408A. The lower horizontal traces 410L(1)-410L(N) are disposed parallel to each other in a lower horizontal row 410L. The right vertical interconnects 408B(1)-408B(N) are disposed parallel to each other in a right vertical row 408B, and the upper horizontal traces 410U(1)-410U(N) are disposed parallel to each other in an upper horizontal row 410U. Each of the rows 408A, 410L, 408B, and 410U extend in the longitudinal direction of the axis A4 of the rectangular coil 400. The other end of the rectangular coil 400 is a second terminal 412 of the inductor 402. The inductance of the inductor 402 is based on the number of windings 404, the length of the rectangular coil 400 in the direction of the axis A4, the dimensions of the windings 404, and other factors. Due to these factors, the inductor 402 would have a different inductance than a rectangular coil 500 for forming an inductor 502 illustrated in FIG. 5. Another factor in determining the inductance of the inductors 402 and 502 is the magnetic permeability of the air occupying the core spaces CS4 and CS5. Magnetic permeability of core material is a factor determining the strength of a magnetic field formed by an inductor, which determines the inductance of an inductor.

Figure 5:
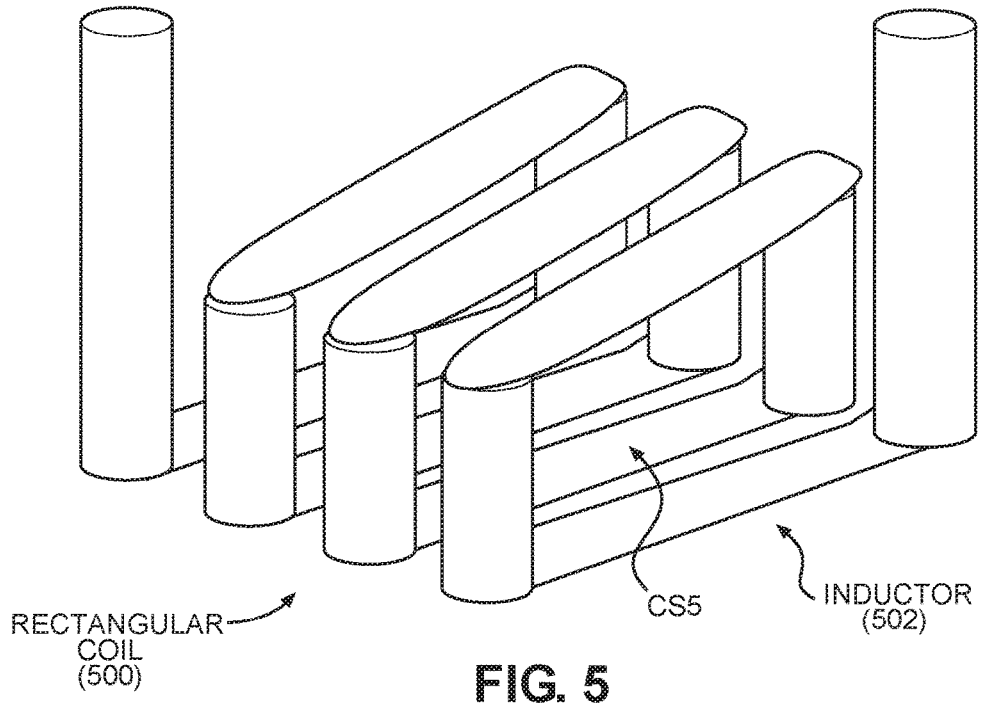
FIG. 5 is a perspective view of another example of a rectangular coil forming a 3D inductor.
Figure 6:
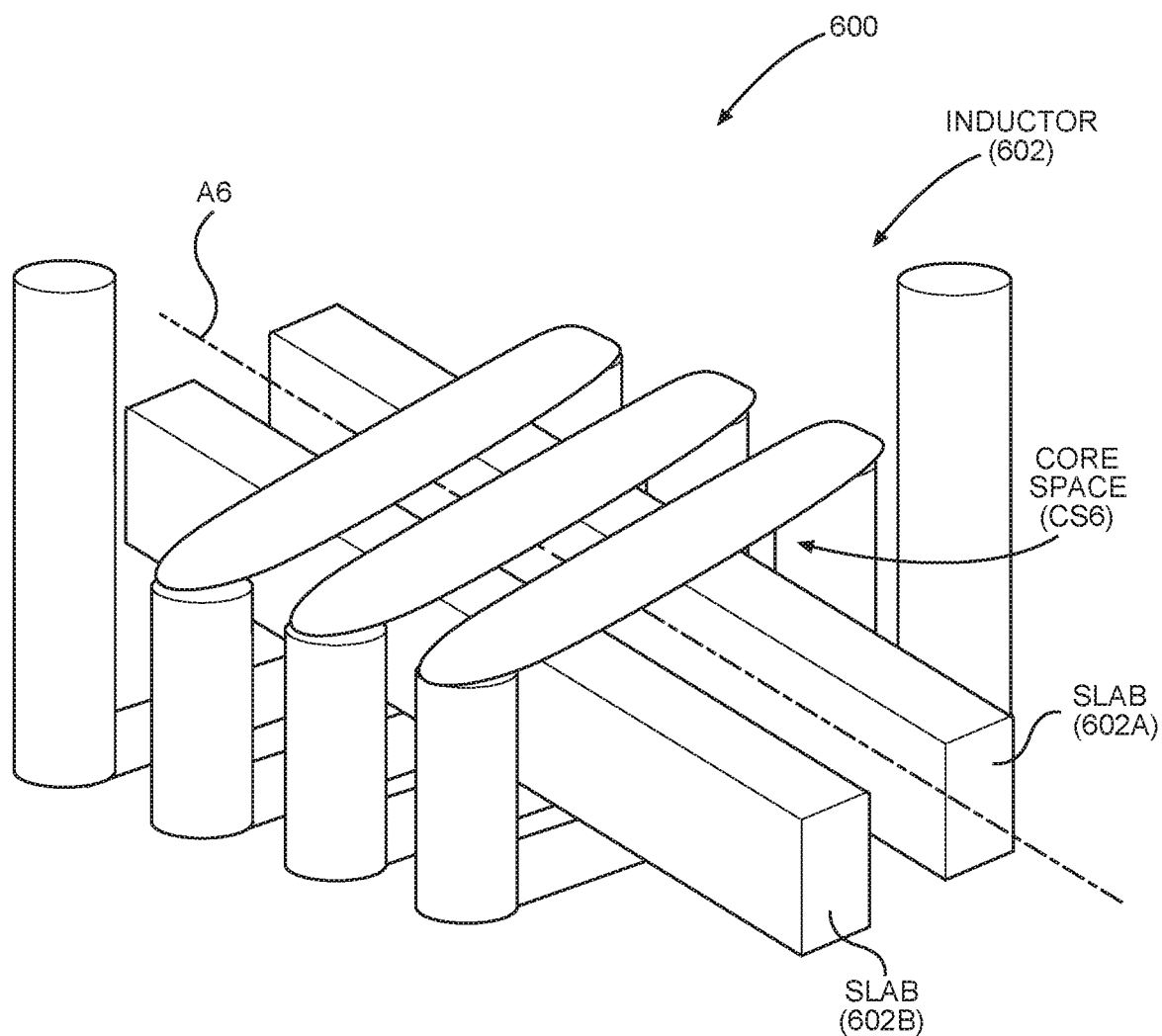
FIG. 6 is a perspective view of the rectangular coil in FIG. 5 including slabs of magnetic material in a core space of the rectangular coil to increase inductance.

FIG. 6 illustrates a rectangular coil 600, like the rectangular coil 500 in FIG. 5, with slabs 602A and 602B of magnetic material displacing some of the air in core space CS6. The magnetic material of the slabs 602A and 602B has a higher magnetic permeability compared to the air occupying the core space CS5. Therefore, the inductor 602 in FIG. 6 including the slabs 602A and 602B of magnetic material would have greater inductance than the inductor 502 in FIG. 5 having an air core. Thus, adding magnetic material in the core space of an inductor can be used to increase inductance of a rectangular coil of a given size, or reduce a size of an inductor coil but still provide the same inductance as a larger coil.

Figure 7:
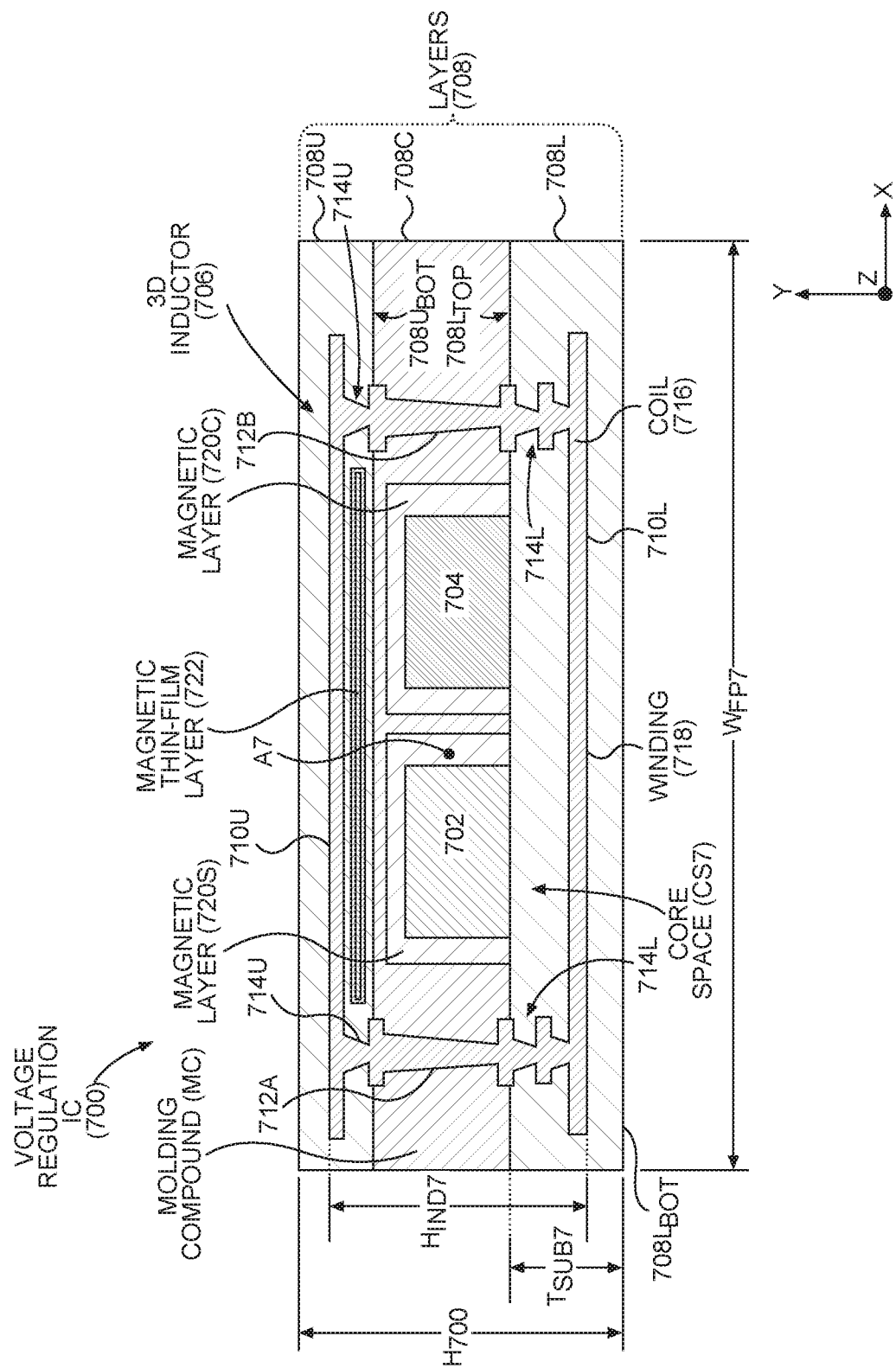
FIG. 7 is a cross-sectional side view of an exemplary voltage regulation IC including active circuit components and capacitors disposed within a core space of a 3D inductor that is integrated into layers of the voltage regulation IC to reduce height and footprint width.

FIG. 7 is a cross-sectional side view of an exemplary voltage regulation IC 700 including a switching circuit 702 and a capacitor 704. The voltage regulation IC 700 is an example of a 3D inductor integrated into structural layers of a voltage regulation IC with other circuit components disposed within a core space of the 3D inductor for a voltage regulation circuit having a smaller footprint and smaller height than functionally equivalent circuits of discrete components mounted on a substrate.

The switching circuit 702 and the capacitor 704 are referred to collectively as "circuit components 702, 704". The switching circuit 702 may be a circuit for controlling switching of the power supply signal to an LC circuit according to a duty cycle. In this regard, controlling switching of the power supply signal means switching between providing and not providing the power supply signal. The switching circuit 702 may also be any logic circuit employed in a voltage regulation circuit. To reduce a size of the voltage regulation IC 700, spaces occupied by the switching circuit 702, the capacitor 704, and a 3D inductor 706 are overlapped by disposing the circuit components 702, 704 within a core space CS7 of the 3D inductor 706. This is made possible by integrating the 3D inductor 706 into layers 708, which are structural layers of the voltage regulation IC 700. FIG. 7 is a cross-sectional side view of the voltage regulation IC 700 in a plane including a horizontal X-axis and a vertical Y-axis, with a longitudinal axis A7 of the voltage regulation IC 700 being in the Z-axis direction.

The height $H_{100}$ of the SMPS circuit 100 in FIG. 1 includes the height $H_{IND1}$ of the inductor 106 and the thickness $T_{SUB1}$ of the substrate 108 on which the inductor 106 is mounted. In contrast, in the voltage regulation IC 700 in FIG. 7, the 3D inductor 706 is integrated into a lower substrate 708L, beneath the circuit components 702, 704. The height $H_{IND7}$ of the inductor 706 vertically overlaps with the thickness $T_{SUB7}$ of the lower substrate 708L. Therefore, the height $H_{700}$ of the voltage regulation IC 700 may be less than the sum of the thickness $T_{SUB7}$ of the lower substrate 708L and the height $H_{IND7}$ of the inductor 706. Accordingly, if the inductor height $H_{IND7}$ in the voltage regulation IC 700 is the same as the height $H_{IND1}$ of the inductor 106 of the SMPS circuit 100 in FIG. 1, the height $H_{700}$ of the voltage regulation IC 700 can be less than the height $H_{100}$ of the SMPS circuit 100. Alternatively, the height $H_{700}$ of the voltage regulation IC 700 could be the same as the height $H_{100}$ of the SMPS circuit 100 if the inductor height $H_{IND7}$ in the voltage regulation IC 700 is made to be much larger than the height $H_{IND1}$ of the inductor 106 in the SMPS circuit 100 in FIG. 1 to provide greater inductance.

In addition, the footprint width $W_{FP1}$ of the SMPS circuit 100 in FIG. 1 is based on the combined widths of the respective circuit components 102, 104, and 106 mounted on the substrate 108. In contrast, the switching circuit 702 and the capacitor 704 in FIG. 7 are disposed within the core space CS7 of the 3D inductor 706 that is integrated into the layers 708 of the voltage regulation IC 700. Therefore, the footprint width $W_{FP7}$ of the voltage regulation IC 700 is based on the widths of the switching circuit 702 and the capacitor 704 plus a small addition of width for the vertical segments of the 3D inductor 706. As a result, the core space CS7 of the 3D inductor 706 in the voltage regulation IC 700 can have a larger cross-section (providing greater inductance) than the inductor 106 while the footprint width $W_{FP7}$ of the voltage regulation IC 700 is the same as or smaller than the footprint width $W_{FP1}$ of the SMPS circuit 100 in FIG. 1.

Therefore, the voltage regulation IC 700 in FIG. 7, including the integrated 3D inductor 706, can have a smaller height $H_{700}$ and footprint width $W_{FP7}$ than the height $H_{100}$ and footprint width $W_{FP1}$, respectively, of the SMPS circuit 100 in FIG. 1 without a reduction in inductance.

Structurally, the voltage regulation IC 700 includes an upper substrate 708U including a plurality of upper horizontal traces 710U, the lower substrate 708L below the upper substrate 708U including a plurality of lower horizontal traces 710L, and a circuit layer 708C between the upper substrate 708U and the lower substrate 708L. The circuit layer 708C includes a plurality of first vertical interconnects 712A and a plurality of second vertical interconnects 712B. The plurality of first vertical interconnects 712A are each coupled to a first end of one of the upper horizontal traces 710U and to a first end of one of the lower horizontal traces 710L. The plurality of second vertical interconnects 712B are each coupled to a second end of one of the upper horizontal traces 710U and to a second end of one of the lower horizontal traces 710L.

The circuit layer 708C also includes one or more of the circuit components 702, 704. The 3D inductor 706 is electrically coupled to at least one of the one or more circuit components 702, 704. The 3D inductor 706 includes a coil 716 extending along the longitudinal axis A7. A cross-section of the coil 716 that is orthogonal to the longitudinal axis A7 includes at least one of the one or more circuit components 702, 704. The coil 716 includes windings 718 around (i.e., above, below and on both sides of) the circuit components 702, 704. The windings 718 are formed by the upper horizontal traces 710U, the first vertical interconnects 712A, the lower horizontal traces 710L, and the second vertical interconnects 712B. Contacts 714U are formed in the upper substrate 708U to extend vertically between ends of the upper horizontal traces 710U and a bottom surface 708U$_{BOT}$ of the upper substrate 708U. Contacts 714L are also formed in the lower substrate 708L between ends of the lower horizontal traces 710L and a top surface 708L$_{TOP}$ of the lower substrate 708L.

The lower substrate 708L includes the contacts 714L to provide connections to the capacitor 704 and switching circuit 702 on the top surface 708L$_{TOP}$. A bottom surface 708L$_{BOT}$ includes connections that are configured to couple the circuit components 702, 704 to an external circuit, such as a PCB. The upper and lower horizontal traces 710U and 710L are conductive and may be formed within the upper and lower substrates 708U and 708L, respectively. The upper and lower horizontal traces 710U and 710L may be linear and planar, but may also be non-planar and/or non-linear conductive traces. The upper and lower horizontal traces 710U and 710L, and the upper and lower contacts 714U and 714L may be formed of a metal, such as aluminum or copper, or another metal or conductive material. The upper and lower horizontal traces 710U and 710L may be formed by copper layers in the upper and lower substrates by, for example, known photolithographic processes.

The first vertical interconnects 712A each couple an end of one of the upper horizontal traces 710U to an end of one of the lower horizontal traces 710L. Each of the second vertical interconnects 712B couples another end of the one of the upper horizontal traces 710U to another end of the one of the lower horizontal traces 710L. More specifically, the first vertical interconnects 712A and the second vertical interconnects 712B extend between the contacts 714U in the upper substrate 708U and the contacts 714L in the lower substrate 708L. Thus, the first and second vertical interconnects 712A and 712B couple to the upper and lower horizontal traces 710U and 710L via the contacts 714U and 714L.

Together, the vertical interconnects 712A, 712B, the upper horizontal traces 710U, the lower horizontal traces 710L, and the contacts 714U, 714L connect sequentially to form the coil 716, similar to those illustrated in FIGS. 4-6. The coil 716 is formed of the windings 718 and has the core space CS7. The longitudinal axis A7 of the core space CS7 extends in a Z-axis direction in FIG. 7. Specifically, the windings 718 may be formed beginning with one of the first vertical interconnects 712A. The first vertical interconnect 712A couples to a first end (e.g., left end) of a first upper horizontal trace 710U via a first contact 714U and couples to a first end of a first lower horizontal trace 710L via a contact 714L. One of the second vertical interconnects 712B couples to a second end (e.g., right end) of the first lower horizontal trace 710L via a second contact 714L and couples to a second end of a second upper horizontal trace 710U (not shown) via a second contact 714U. The second upper horizontal trace 710U is next to the first upper horizontal trace 710U. In this regard, "next to" indicates the next upper horizontal trace 710U corresponding to a next winding 718 of the coil 716 in the direction of the longitudinal axis A7. A first end of the second upper horizontal trace 710U couples to another one of the first vertical interconnects 712A (not shown), and the sequence continues.

The circuit components 702, 704 may be disposed within the core space CS7 of the 3D inductor 706 in a cross-section of the 3D inductor 706 that is orthogonal to the longitudinal axis A7. The cross-section of the 3D inductor 706 may include the capacitor 704 and the switching circuit 702. Alternatively, the circuit components 702, 704 may be disposed within the core space CS7 of the 3D inductor 706 in a first cross-section that is parallel to the longitudinal axis A7. In other words, the cross-section of the 3D inductor 706 may include only one of the capacitor 704 and the switching circuit 702.

The core space CS7 of the 3D inductor 706 in the voltage regulation IC 700 occupies space within each of the upper substrate 708U, the lower substrate 708L, and the circuit layer 708C. The core space CS7 within the lower substrate 708L includes metal traces and interconnects (shown in FIG. 10) for coupling the circuit components 702, 704 to each other, to the 3D inductor 706, and to an external circuit or a PCB (not shown). Due to the presence of these traces and interconnects within the lower substrate 708L, it would be difficult to add magnetic material in the lower substrate 708L for the purpose of increasing magnetic permeability.

In the circuit layer 708C, the switching circuit 702 and the capacitor 704 are mounted on the top surface 708L$_{TOP}$ of the lower substrate 708L and occupy some of the core space CS7. After the circuit components 702, 704 are mounted to the lower substrate 708L, a molding compound MC is added to form the circuit layer 708C. The molding compound MC is provided for structural support and is not magnetic material. Therefore, to increase the magnetic permeability of the core space CS7 within the circuit layer 708C, some of the molding compound MC can be displaced by magnetic material. In this regard, before the molding compound MC is added, a magnetic layer 720C is formed on the top side and vertical sides of the capacitor 704 within the circuit layer 708C, and a magnetic layer 720S is formed on a top side and vertical sides of the switching circuit 702. After the molding compound MC is added and planarized, the first vertical interconnects 712A and the second vertical interconnects 712B are formed as vias through the molding compound MC. The first vertical interconnects 712A and the second vertical interconnects 712B may be formed by known processes for via formation.

The upper substrate 708U includes the upper horizontal traces 710U but does not include any traces or interconnects between the upper horizontal traces 710U and the bottom surface 708U$_{BOT}$ of the upper substrate 708U. The upper substrate 708U is not formed of magnetic material. Thus, the magnetic permeability of the core space CS7 can be further increased by including a magnetic thin-film layer 722, which is formed of at least one layer of a magnetic material, within the upper substrate 708U. The magnetic thin-film layer 722 is formed between an upper row of the upper horizontal traces 710U and the circuit layer 708C coupled to the bottom surface 708U$_{BOT}$ of the upper substrate 708U. The magnetic thin-film layer 722 may be formed of one or more layers of magnetic material(s) including cobalt tantalum zirconium (CoTaZr) and nickel iron (NiFe) separated by silicon dioxide (SiO$_2$) or other oxide thin-film layers. The magnetic thin-film layer 722 may be covered with a polymer planarization layer (not shown).

Figure 8:
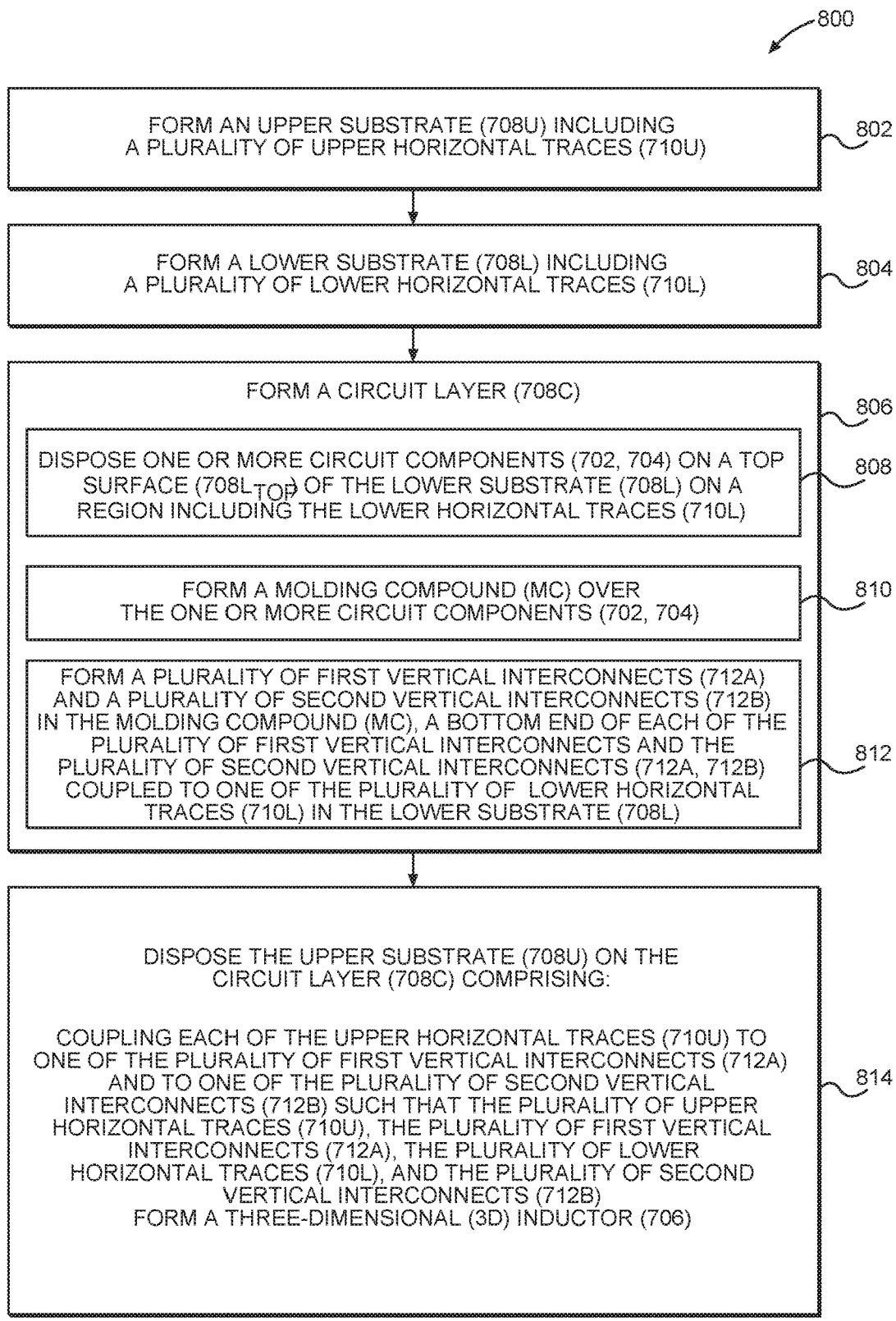
FIG. 8 is a flowchart illustrating a method of fabricating the voltage regulation IC in FIG. 7.

FIG. 8 is a flowchart illustrating an exemplary method 800 of fabricating the voltage regulation IC 700 in FIG. 7. The method 800 includes forming the upper substrate 708U including the plurality of upper horizontal traces 710U (block 802) and forming the lower substrate 708L including the plurality of lower horizontal traces 710L (block 804). The method includes forming the circuit layer 708C (block 806), including disposing one or more of the circuit components 702, 704 on the top surface 708L$_{TOP}$ of the lower substrate 708L on a region including the plurality of lower horizontal traces 710L (block 808), forming the molding compound MC over the one or more circuit components 702, 704 (block 810), and forming the plurality of first vertical interconnects 712A and the plurality of second vertical interconnects 712B in the molding compound MC, a bottom end of each the plurality of first vertical interconnects 712A and the plurality of second vertical interconnects 712B coupled to one of the plurality of lower horizontal traces 710L in the lower substrate 708L (block 812). The method 800 further includes disposing the upper substrate 708U on the circuit layer 708C such that each of the plurality of upper horizontal traces 710U couples to one of the plurality of first vertical interconnects 712A and one of the plurality of second vertical interconnects 712B in the circuit layer 708C. Disposing the upper substrate 708U on the circuit layer 708C includes coupling each of the plurality of upper horizontal traces 710U to one of the plurality of first vertical interconnects 712A and to one of the plurality of second vertical interconnects 712B such that the plurality of upper horizontal traces 710U, the plurality of first vertical interconnects 712A, the plurality of lower horizontal traces 710L, and the plurality of second vertical interconnects 712B form the 3D inductor 706 (block 814). The 3D inductor 706 includes the coil 716 extending along the longitudinal axis A7, and a cross-section of the coil 716 that is orthogonal to the longitudinal axis A7 includes at least one of the circuit components 702, 704.

Forming the upper substrate 708U also includes forming the upper horizontal traces 710U parallel to each other in an upper row in the upper substrate 708U, the upper row extending in the direction of the longitudinal axis A7 of the 3D inductor 706. Forming the lower substrate 708L further includes forming the lower horizontal traces 710L parallel to each other in a lower row in the lower substrate 708L, the lower row extending in the direction of the longitudinal axis A7. Forming the upper substrate 708U also includes forming the magnetic thin-film layer 722 in a region of the upper substrate 708U including the upper horizontal traces 710U. Disposing the circuit components 702, 704 on the top surface 708L$_{TOP}$ of the lower substrate 708L includes disposing the capacitor 704 and the switching circuit 702 on the lower substrate 708L. Disposing the capacitor 704 on the lower substrate 708L includes mounting the capacitor 704 on the lower substrate 708L, and disposing the switching circuit 702 on the lower substrate 708L includes mounting the switching circuit 702 to the lower substrate 708L. Forming the circuit layer 708C includes forming the first magnetic layer 720C on the sides of the capacitor 704 and forming the second magnetic layer 720S on the sides of the switching circuit 702. The longitudinal axis A7 of the 3D inductor 706 extends in a first direction, and disposing the circuit components 702, 704 on the top surface 708L$_{TOP}$ of the lower substrate 708L includes disposing the capacitor 704 and the switching circuit 702 in a cross-section of the 3D inductor 706 orthogonal to the longitudinal axis A7. Alternatively, disposing the circuit components 702, 704 on the top surface 708L$_{TOP}$ of the lower substrate 708L includes disposing the capacitor 704 and the switching circuit 702 in a cross-section of the 3D inductor 706 parallel to the longitudinal axis A7.

Figure 9:
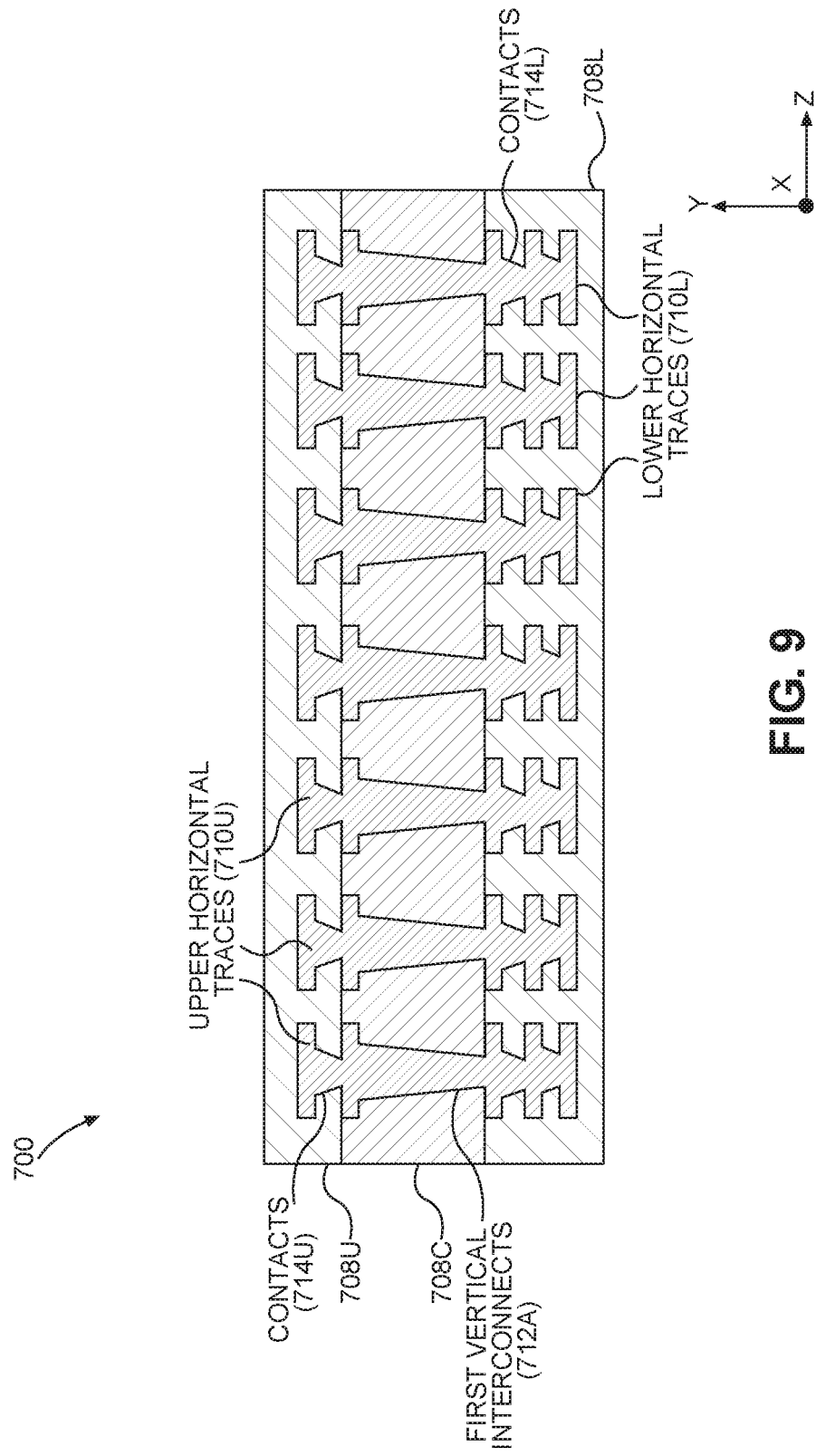
FIG. 9 is an illustration of a cross-section of the exemplary voltage regulation IC in FIG. 7 through vertical interconnects in a longitudinal direction of the 3D inductor, each of the vertical interconnects forming one side of a winding of a rectangular coil.

FIG. 9 is an example of a cross-section of the voltage regulation IC 700 in FIG. 7 in a plane extending vertically in a direction of the Y-axis and horizontally in a direction of the Z-axis (i.e., in the direction of the longitudinal axis A7). The cross-section in FIG. 9 illustrates one side of the coil 716, similar to the left row 408A of vertical interconnects 408A(1)-408A(N) in FIG. 4. The first vertical interconnects 712A couple to the lower horizontal traces 710L in the lower substrate 708L via the contacts 714L and couple to the upper horizontal traces 710U in the upper substrate 708U via the contacts 714U. The first vertical interconnects 712A and the contacts 714L and 714U in the example shown in FIG. 9 have conical shapes representative of vias formed by well-known processes in ICs, but the first vertical interconnects 712A and the contacts 714L and 714U may have other shapes when formed by different processes.

Figure 10:
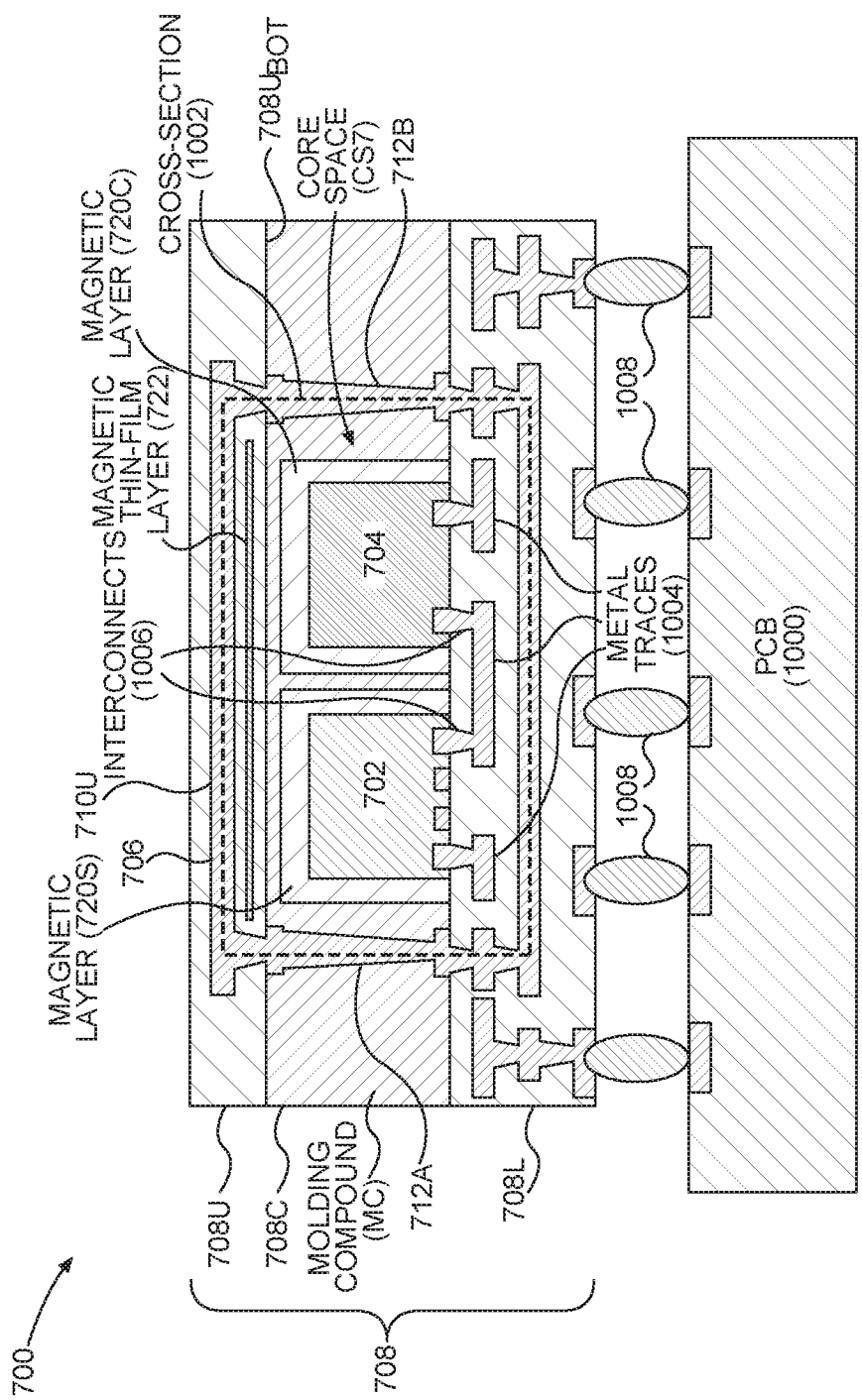
FIG. 10 is a cross-sectional side view of the voltage regulation IC in FIG. 7 as a field-replaceable unit mounted on a PCB with solder ball connectors.

FIG. 10 is a cross-sectional illustration of the voltage regulation IC 700 in FIG. 7 including a 3D inductor integrated into structural layers of a voltage regulation IC with other circuit components disposed within a core space of the 3D inductor for a voltage regulation circuit having a smaller footprint and smaller height than functionally equivalent circuits of discrete components mounted on a substrate mounted on a PCB 1000. A cross-section 1002 of the core space CS7 is illustrated in FIG. 10. The lower substrate 708L includes metal traces 1004 and interconnects 1006 for electrically coupling the circuit components 702, 704. FIG. 10 shows that the voltage regulation IC 700 is electrically coupled to the PCB 1000 by solder balls 1008, but the voltage regulation IC 700 is not limited to this type of PCB connection. The voltage regulation IC 700 occupies less volume on the PCB 1000 than would be occupied by the SMPS circuit 100 in FIG. 1, by integrating the 3D inductor 706 into structural layers 708 and disposing the switching circuit 702 and the capacitor 704 within the core space CS7 of the 3D inductor 706.

A voltage regulation IC including a switching circuit and a capacitor disposed within a core space of a 3D inductor integrated into structural layers of the voltage regulation IC to achieve a reduced height and footprint width as illustrated in any of FIGS. 7 and 10 according to any aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
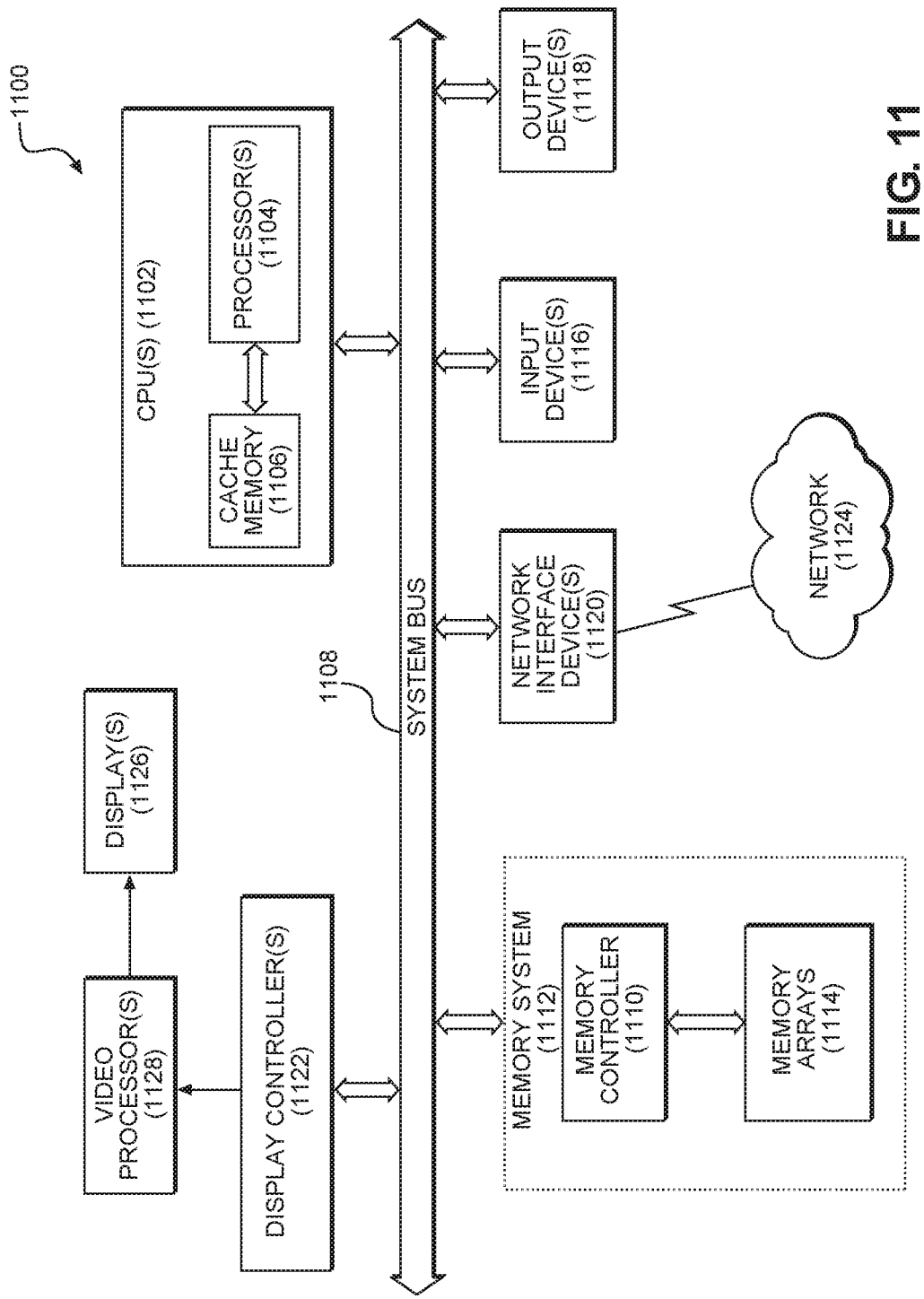
FIG. 11 is a block diagram of an exemplary processor-based system that can include a voltage regulation IC having a 3D inductor integrated into the structural layers of the voltage regulation IC, and circuit elements disposed within a core space of the 3D inductor to reduce height and footprint width, as illustrated in any of FIGS. 7 and 10.

In this regard, FIG. 11 illustrates an example of a processor-based system 1100 including a 3D inductor integrated into structural layers of a voltage regulation IC with other circuit components disposed within a core space of the 3D inductor for a voltage regulation circuit having a smaller footprint and smaller height than functionally equivalent circuits of discrete components mounted on a substrate as illustrated in any of FIGS. 7 and 10, and according to any aspects disclosed herein. In this example, the processor-based system 1100 includes one or more central processor units (CPUs) 1102, which may also be referred to as CPU or processor cores, each including one or more processors 1104. The CPU(s) 1102 may have cache memory 1106 coupled to the processor(s) 1104 for rapid access to temporarily stored data. As an example, the processor(s) 1104 could include a 3D inductor integrated into structural layers of a voltage regulation IC with other circuit components disposed within a core space of the 3D inductor for a voltage regulation circuit having a smaller footprint and smaller height than functionally equivalent circuits of discrete components mounted on a substrate as illustrated in any of FIGS. 7 and 10, and according to any aspects disclosed herein. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112 that includes the memory controller 1110 and one or more memory arrays 1114, one or more input devices 1116, one or more output devices 1118, one or more network interface devices 1120, and one or more display controllers 1122, as examples. Each of the memory system 1112, the one or more input devices 1116, the one or more output devices 1118, the one or more network interface devices 1120, and the one or more display controllers 1122 can include a 3D inductor integrated into structural layers of a voltage regulation IC with other circuit components disposed within a core space of the 3D inductor for a voltage regulation circuit having a smaller footprint and smaller height than functionally equivalent circuits of discrete components mounted on a substrate as illustrated in any of FIGS. 7 and 10, and according to any aspects disclosed herein. The input device(s) 1116 can include any type of input device, including, but not limited to, input keys, switches, voice processors, etc. The output device(s) 1118 can include any type of output device, including, but not limited to, audio, video, other visual indicators, etc. The network interface device(s) 1120 can be any device configured to allow exchange of data to and from a network 1124. The network 1124 can be any type of network, including, but not limited to, a wired or wireless network, a private or public network, a local area network (LAN), a wireless local area network (WLAN), a wide area network (WAN), a BLUETOOTH network, and the Internet. The network interface device(s) 1120 can be configured to support any type of communications protocol desired.

The CPU(s) 1102 may also be configured to access the display controller(s) 1122 over the system bus 1108 to control information sent to one or more displays 1126. The display controller(s) 1122 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc. The display controller(s) 1122, display(s) 1126, and/or the video processor(s) 1128 can include a 3D inductor integrated into structural layers of a voltage regulation IC with other circuit components disposed within a core space of the 3D inductor for a voltage regulation circuit having a smaller footprint and smaller height than functionally equivalent circuits of discrete components mounted on a substrate as illustrated in any of FIGS. 7 and 10, and according to any aspects disclosed herein.

Figure 12:
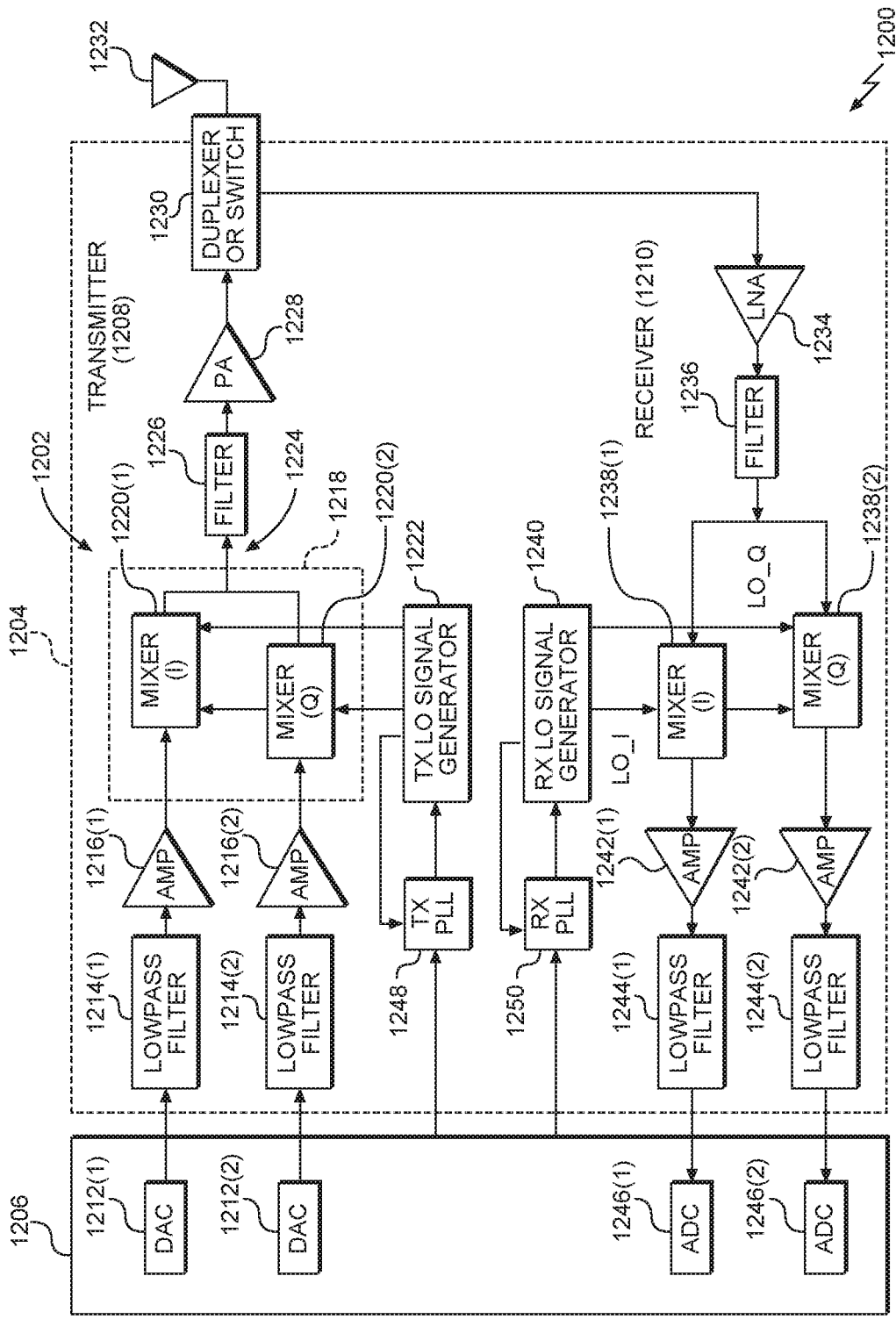
FIG. 12 is a block diagram of an exemplary wireless communications device that includes radio frequency (RF) components formed from an IC, including a voltage regulation IC having a 3D inductor integrated into the structural layers of the voltage regulation IC, and circuit elements disposed within a core space of the 3D inductor to reduce height and footprint width, as illustrated in any of FIGS. 7 and 10.

FIG. 12 illustrates an exemplary wireless communications device 1200 that includes radio frequency (RF) components formed from an IC 1202, wherein any of the components therein can include a 3D inductor integrated into structural layers of a voltage regulation IC with other circuit components disposed within a core space of the 3D inductor for a voltage regulation circuit having a smaller footprint and smaller height than functionally equivalent circuits of discrete components mounted on a substrate as illustrated in any of FIGS. 7 and 10, and according to any aspects disclosed herein. The wireless communications device 1200 may include or be provided in any of the above-referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RF ICs (RFICs), mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1210. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals through mixers 1220(1), 1220(2) from a TX LO signal generator 1222 to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmitted RF signal. The transmitted RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but, is to be accorded the widest scope consistent with the principles and novel features disclosed herein.

What is claimed is:

1. A voltage regulation integrated circuit (IC), comprising:
an upper substrate comprising a plurality of upper horizontal traces;
a lower substrate below the upper substrate and comprising a plurality of lower horizontal traces; and
a circuit layer between the upper substrate and the lower substrate, the circuit layer comprising:
a plurality of first vertical interconnects each coupled to a first end of one of the plurality of upper horizontal traces and a first end of one of the plurality of lower horizontal traces;
a plurality of second vertical interconnects each coupled to a second end of one of the plurality of upper horizontal traces and a second end of one of the plurality of lower horizontal traces;
one or more circuit components disposed on the lower substrate; and
a three-dimensional (3D) inductor electrically coupled to at least one of the one or more circuit components, the 3D inductor comprising a coil extending along a longitudinal axis, a cross-section of the coil orthogonal to the longitudinal axis including the at least one of the one or more circuit components.

2. The voltage regulation IC of claim 1, wherein the coil comprises windings formed by the plurality of upper horizontal traces, the plurality of first vertical interconnects, the plurality of lower horizontal traces, and the plurality of second vertical interconnects.

3. The voltage regulation IC of claim 1, wherein the at least one of the one or more circuit components comprises a switching circuit, and at least one other circuit component among the one or more circuit components comprises a capacitor.

4. The voltage regulation IC of claim 3, wherein the circuit layer further comprises:
a first magnetic layer on sides of the capacitor; and
a second magnetic layer on sides of the switching circuit.

5. The voltage regulation IC of claim 1, wherein the upper substrate further comprises the plurality of upper horizontal traces parallel to each other, and a magnetic thin-film layer between the plurality of upper horizontal traces and the circuit layer.

6. The voltage regulation IC of claim 3, wherein:
the longitudinal axis of the 3D inductor extends in a first direction;
the cross-section of the coil of the 3D inductor orthogonal to the longitudinal axis includes the capacitor and the switching circuit.

7. The voltage regulation IC of claim 3, wherein:
the longitudinal axis of the 3D inductor extends in a first direction;
the cross-section of the coil of the 3D inductor orthogonal to the longitudinal axis includes only one of the capacitor and the switching circuit.

8. The voltage regulation IC of claim 3, wherein the lower substrate further comprises:
a first surface comprising connections to the capacitor and the switching circuit; and
a second surface comprising connections configured to couple at least one of the one or more circuit components to a printed circuit board (PCB).

9. The voltage regulation IC of claim 1, wherein:
the longitudinal axis of the 3D inductor extends in a first direction;
the plurality of upper horizontal traces are disposed parallel to each other in an upper row in the upper substrate, the upper row extending in the first direction;
the plurality of lower horizontal traces are disposed parallel to each other in a lower row in the lower substrate, the lower row extending in the first direction; and
the plurality of first vertical interconnects are disposed parallel to each other in a first row, the plurality of second vertical interconnects are disposed parallel to each other in a second row, and the first and second rows extend in the first direction.

10. The voltage regulation IC of claim 9, wherein a winding of the 3D inductor comprises:
a first one of the plurality of first vertical interconnects coupled to a first end of a first one of the plurality of upper horizontal traces and to a first end of a first one of the plurality of lower horizontal traces; and
a first one of the plurality of second vertical interconnects coupled to a second end of the first one of the plurality of lower horizontal traces and to a second end of another one of the plurality of upper horizontal traces next to the first one of the plurality of upper horizontal traces in the upper row.

11. The voltage regulation IC of claim 3, wherein the lower substrate further comprises a molding compound.

12. The voltage regulation IC of claim 1 integrated in an integrated circuit (IC).

13. The voltage regulation IC of claim 1, integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. A method of fabricating a voltage regulation integrated circuit (IC), the method comprising:
forming an upper substrate comprising a plurality of upper horizontal traces;
forming a lower substrate comprising a plurality of lower horizontal traces; and
forming a circuit layer, comprising:
disposing one or more circuit components on a surface of the lower substrate on a region including the plurality of lower horizontal traces;
forming a molding compound over the one or more circuit components;
forming a plurality of first vertical interconnects and a plurality of second vertical interconnects in the molding compound, a bottom end of each of the plurality of first vertical interconnects and the plurality of second vertical interconnects coupled to one of the plurality of lower horizontal traces in the lower substrate; and
disposing the upper substrate on the circuit layer, comprising coupling each of the plurality of upper horizontal traces to one of the plurality of first vertical interconnects and to one of the plurality of second vertical interconnects, such that the plurality of upper horizontal traces, the plurality of first vertical interconnects, the plurality of lower horizontal traces, and the plurality of second vertical interconnects form a three-dimensional (3D) inductor.

15. The method of claim 14, wherein:
forming the upper substrate further comprises forming the plurality of upper horizontal traces parallel to each other in an upper row in the upper substrate, the upper row extending in a first direction of a longitudinal axis of the 3D inductor; and
forming the lower substrate further comprises forming the plurality of lower horizontal traces parallel to each other in a lower row in the lower substrate, the lower row extending in the first direction.

16. The method of claim 14, wherein:
the 3D inductor comprises a coil extending along a longitudinal axis; and
a cross-section of the coil orthogonal to the longitudinal axis includes at least one of the one or more circuit components.

17. The method of claim 14, wherein forming the upper substrate further comprises forming a magnetic thin-film layer in a region of the upper substrate comprising the plurality of upper horizontal traces.

18. The method of claim 14, wherein disposing the one or more circuit components on the surface of the lower substrate further comprises disposing a capacitor and a switching circuit on the lower substrate.

19. The method of claim 18, further comprising:
forming a first magnetic layer on sides of the capacitor; and
forming a second magnetic layer on sides of the switching circuit.

20. The method of claim 18, wherein:
a longitudinal axis of the 3D inductor extends in a first direction; and
disposing the one or more circuit components on the surface of the lower substrate further comprises disposing the capacitor and the switching circuit in a cross-section of the 3D inductor orthogonal to the longitudinal axis.

21. The method of claim 18, wherein:
a longitudinal axis of the 3D inductor extends in a first direction; and
disposing the one or more circuit components on the surface of the lower substrate further comprises disposing the capacitor and the switching circuit in a cross-section of the 3D inductor parallel to the longitudinal axis.

* * * * *